US008920046B2

(12) United States Patent
Loveless

(10) Patent No.: US 8,920,046 B2
(45) Date of Patent: Dec. 30, 2014

(54) TEST ADAPTER FOR COMPUTER CHIPS

(75) Inventor: Richard Loveless, Burlington, VT (US)

(73) Assignee: Huber + Suhner AG, Herisau (CH)

( * ) Notice: Subject to any disclaimer, the term of this patent is extended or adjusted under 35 U.S.C. 154(b) by 555 days.

(21) Appl. No.: 12/408,907

(22) Filed: Mar. 23, 2009

(65) Prior Publication Data

US 2010/0142897 A1 Jun. 10, 2010

(30) Foreign Application Priority Data

Dec. 5, 2008 (CH) ........................................ 1910/08

(51) Int. Cl.
*G02B 6/36* (2006.01)
*G01R 1/04* (2006.01)

(52) U.S. Cl.
CPC .................................... *G01R 1/0433* (2013.01)
USPC ............................... 385/89; 385/88; 356/73.1

(58) Field of Classification Search
USPC ........................... 385/88, 89, 53, 92; 356/73.1
See application file for complete search history.

(56) References Cited

U.S. PATENT DOCUMENTS

| 4,554,505 | A | * | 11/1985 | Zachry ..................... 324/750.25 |
| 4,931,726 | A | | 6/1990 | Kasukabe et al. |
| 5,046,966 | A | | 9/1991 | Snyder et al. |
| 5,896,037 | A | | 4/1999 | Kudla et al. |
| 6,727,717 | B2 | * | 4/2004 | Kim et al. ................. 324/756.02 |
| 6,873,167 | B2 | * | 3/2005 | Goto et al. ................ 324/754.05 |
| 2003/0057983 | A1 | | 3/2003 | Kim et al. |
| 2003/0117129 | A1 | | 6/2003 | Parrish |
| 2004/0179771 | A1 | * | 9/2004 | Verhagen et al. ................ 385/17 |
| 2007/0167083 | A1 | | 7/2007 | Mineo |

FOREIGN PATENT DOCUMENTS

| JP | 62-153776 | 7/1987 |
| JP | 4-359172 | 12/1992 |
| JP | 5-160214 | 6/1993 |
| JP | 8-110366 | 4/1996 |
| JP | 2002-502019 | 1/2002 |
| WO | WO 99/38197 | 7/1999 |

* cited by examiner

*Primary Examiner* — Charlie Peng
*Assistant Examiner* — Mary El Shammaa
(74) *Attorney, Agent, or Firm* — Pauley Petersen & Erickson

(57) ABSTRACT

The invention relates to a test adapter (1) for operatively connecting a chip to be tested to a test device. The test adapter has a three-dimensional construction with a baseplate (8) and a cover plate (2). The cover plate (2) has a contact array (3) having contact elements (9) coordinated with the chip to be tested in terms of number and arrangement. Arranged between the baseplate (8) and the cover plate (2) are side walls (4) which are arranged at an angle with respect to the cover plate (2) and have a number of individual connectors (5) that is coordinated with the chip to be tested.

18 Claims, 3 Drawing Sheets

TEST ADAPTER FOR COMPUTER CHIPS

BACKGROUND OF THE INVENTION

1. Field of the Invention

The invention is in the field of test devices, or respectively test adapters for testing integrated circuits (IC) such as computer chips and (micro) processors.

2. Discussion of Related Art

Processors such as those used in commercially available computers (PC) include ever increasing connections. In the future, up to 1024 connections are expected, serving for transmitting data and/or power from and to a processor core. The frequencies at which the data is transmitted lie in the gigahertz range.

Every IC is checked and tested with regard to its function between the various production steps and during the final inspection. The prior art discloses for this purpose so-called test devices which nowadays comprise a so-called test or load board. In the case of these load boards, many serial connections are led from a test head to a measuring station. Data rates of up to 6 Gbps are typically achieved at the present time. In the future, data rates of up to 15 Gbps or more are to be expected. A hundred channels per square inch are advantageous on account of the confined space conditions on the load board and the preferably shortest possible PCB connections. Current devices no longer satisfy present-day demands or have a complicated, costly construction.

A chip has contact arrays having a diameter of a few μm, which are to be connected to the measuring apparatus (tester). The prior art uses planar structures for signal lines on PCBs (printed circuit boards), so called microstrips. A microstrip adversely impairs the signal since the attenuation increases as the line length increases. In order to make contact with several hundred pins, very long lines have to be used nowadays. Moreover, high precision is required. A further problem consists in the high mechanical loads which can occur since contact has to be made with each pin with a comparatively high force in order that a secure connection results.

The prior art discloses devices for testing chips having a multiplicity of connections. For each chip, an exchangeable load board is specifically coordinated with the respective chip. Alongside the connections, said load board can also have electronics. The solutions known from the prior art have a two-dimensional, planar construction in which connections which are grouped around a contact array and lie in a plane or parallel with respect thereto serve for connecting the load board to the test machine. These load boards are very large in their construction and additionally have mechanical disadvantages. Moreover, they have a comparatively complicated construction.

U.S. Pat. No. 4,931,726 in the name of Hitachi, Ltd. was published in 1988 and describes a test device for testing chips arranged or respectively soldered on circuit boards. The test device is pressed from above onto the circuit board with the chip. Coaxial connectors are shown schematically and are intended to serve at one end for making contact with conductor tracks or soldered joints on the circuit board. At the other end, the cables are held in two plate-like connection regions butting directly against one another at an angle and contact is made with said cables there by means of spring pins. Continuous coaxial signal routing does not take place, which results in an impairment of the signal quality. The principle shown is not suitable for high channel densities.

US2007/167083 in the name of Advantest was published in 2007 and describes a connector housing block having a very large construction and serving for electrically connecting a test head to connectors of a test device. A chip is arranged on a first plane for test purposes and is operatively connected by means of electrical lines to connectors arranged on a second, parallel plane. Certain parts are mounted in floating fashion.

U.S. Pat. No. 5,896,037 from Method Electronics, Inc. was published in 1999 and discloses a type of test adapter for testing chips. The test adapter has a multilayered construction. The individual connectors are connected via conductor tracks. The test adapter has a two-dimensional construction, that is to say that all the connections are situated in one plane.

SUMMARY OF THE INVENTION

One object of the invention is to disclose a device which avoids the problems from the prior art. A further object of the invention is to disclose a device which can be converted in a simple manner for testing different chips.

The object is achieved by means of the invention defined in the patent claims.

One embodiment of the invention comprises a three-dimensional test adapter which makes it possible as required to make contact coaxially with all the connections of a chip simultaneously. The connections are transferred away from the chip via spatially curved lines to a three-dimensional connection array, with which contact can be made externally in a simple manner. The lines have the same length at least in part, as required, and are kept short in comparison with the prior art. In this way it is possible—in contrast to the (PCB) solutions known from the prior art—for e.g. 1024 channels to be simultaneously connected coaxially to the outside world. Since coaxial cables have much better transmission properties, a huge increase in signal quality is achieved. Moreover, the 3D routing according to the invention enables a significantly higher packing density. Alternatively or supplementarily, it is also possible to use optical conductors and connectors for transmitting the signals from and to the chips.

The test adapter according to the invention can be designed for use in existing chip test devices and forms an operative connection between the chip test device or respectively a load board and the chip to be tested. The test adapter can if required be inserted into a load board or adopt further functions and e.g. completely replace the load board.

For each chip type, a test adapter specifically coordinated with the chip is provided, which has a significantly simpler construction than a conventional load board and, moreover, enables a huge improvement in the signal quality.

The test adapter can as required have an integrated coding which stores or imparts information about the chip to be tested to the test device.

In one embodiment, the test adapter has an approximately parallelepipedal or respectively cubic configuration. A side plate which normally forms the top side of the cube (parallelepiped) has a chip-specific contact array. The contact array comprises a multiplicity of specifically arranged connectors for temporarily operatively connecting the chip to the test adapter. A corresponding number of plug connectors or respectively connector banks are fitted to the adjoining side walls, at an angle with respect to the top side, and are operatively connected via—preferably coaxial—lines to the connectors of the contact array. Other or a mixture of a plurality of connector types (e.g. optical types) can be provided as required. The number of connectors required is determined by the size and form of the side walls (also referred to as side faces).

The test adapter—in particular the side plate with the connector array—advantageously has a mechanically stable construction in order that the mechanical forces which occur during the testing of the chip can be reliably dissipated and no undesirable deformations occur. What is achieved in this way is that contact is made with all the connections of the chip with the predetermined force.

Depending on the field of application, the connectors fitted to the side walls or the side walls themselves can be arranged differently. More or fewer than four side walls can be provided as required. A connector-free region can likewise be provided. If necessary, the base area of the test adapter can also have connectors.

In order to compensate for mechanical tolerances, it is possible to combine the plug connectors of the side walls in connector banks with a—at least on one side—floating mounting. The connector banks advantageously have a coaxial construction (multiple coaxial connectors) since a higher signal quality is thereby achieved.

As a result of the combination of individual connectors in connector banks, the tolerance chain is interrupted in a targeted manner, such that the packing density (channels per area) does not represent a problem. The connector banks have a plurality of individual coaxial connectors arranged in one or two or more rows. In one embodiment, individual coaxial connectors are mounted in floating fashion at least on one connector side by being fixed e.g. in cutouts in a basic body in order to compensate for tolerances. The individual connector banks, at least at the cable end, can be operatively connected to one another to form a larger unit in rigid fashion or in movable fashion to a defined extent. If necessary, the individual connector banks have centering means by means of which the individual connector banks are oriented and aligned separately from one another. The individual connectors themselves can be embodied as a centering aid.

For this purpose, the individual connectors, on each side of the connector, can be press-fitted in one or a plurality of housings serving for retaining the same—in rigid or floating fashion depending on the embodiment. The housings are preferably composed of injection-molded plastic. The operative connection to the cables is effected by pressing or soldering. The individual connectors have as required spring elements by means of which the plug-in force with the counterpart is determined and possible deviations are compensated for to a defined extent. Depending on the embodiment, the spring elements are embodied e.g. in bellows form or have a barrel-shaped configuration which is slotted as required in a longitudinal direction or at a certain angle with respect thereto in such a way that the load level does not exceed a certain value.

In one embodiment, the multiple coaxial connector of a connector bank comprises a female and at least one cable-end male connector part. The cable-end connector part has at least one connector bank with a housing having a basic body. The basic body has cutouts which are arranged in comb-shaped fashion, are accessible from one or two opposite sides and serve for laterally receiving individual connectors. The cable-end connector part can have a plurality of connector banks which are operatively connected laterally alongside one another and to one another. The cable-end connector banks can be operatively connected to one another in floating fashion e.g. by means of elastic connecting elements.

Depending on the embodiment, the cable-end connector banks can also be operatively connected to one another in rigid fashion. The female connector part, which is fixed e.g. rigidly on a circuit board or directly on a side wall, can have a one-piece housing with openings which run parallel and which serve for receiving individual connectors. The connectors can be press-fitted or snap-fitted in the female connector part from the front or rear side. The one-piece housing can have a plurality of rows of openings as required. In order to compensate for geometrical deviations, the individual connectors can be mounted in laterally floating fashion at least in one housing. The connector banks can as required have centering means by means of which the housings are centered relative to one another in the course of the mating process.

In one embodiment, the test adapter has an inner, dimensionally stable frame serving for retaining a cover plate with a contact array and the plug connectors arranged on the side walls. The dimensionally stable frame as required has connection means by means of which the test adapter can be operatively connected mechanically to a test device.

One advantage of the test adapter according to the invention is that an identical line length can be ensured for each connection. In contrast to the load boards known from the prior art, moreover, the test adapter is significantly more stable mechanically and has a much smaller space requirement on account of its three-dimensional structure. Moreover, the cables situated in the interior are largely protected against external mechanical influences. The interior space can also be potted as required.

A further advantage of the invention is that the interior of the three-dimensional test adapter can be used for further tasks. By way of example, there is the possibility of fitting sensors which provide information about the test conditions and ambient parameters.

BRIEF DESCRIPTION OF THE DRAWINGS

The invention is explained in more detail on the basis of the embodiment shown in the figures, in which.

DESCRIPTION OF PREFERRED EMBODIMENTS

Figure 1:
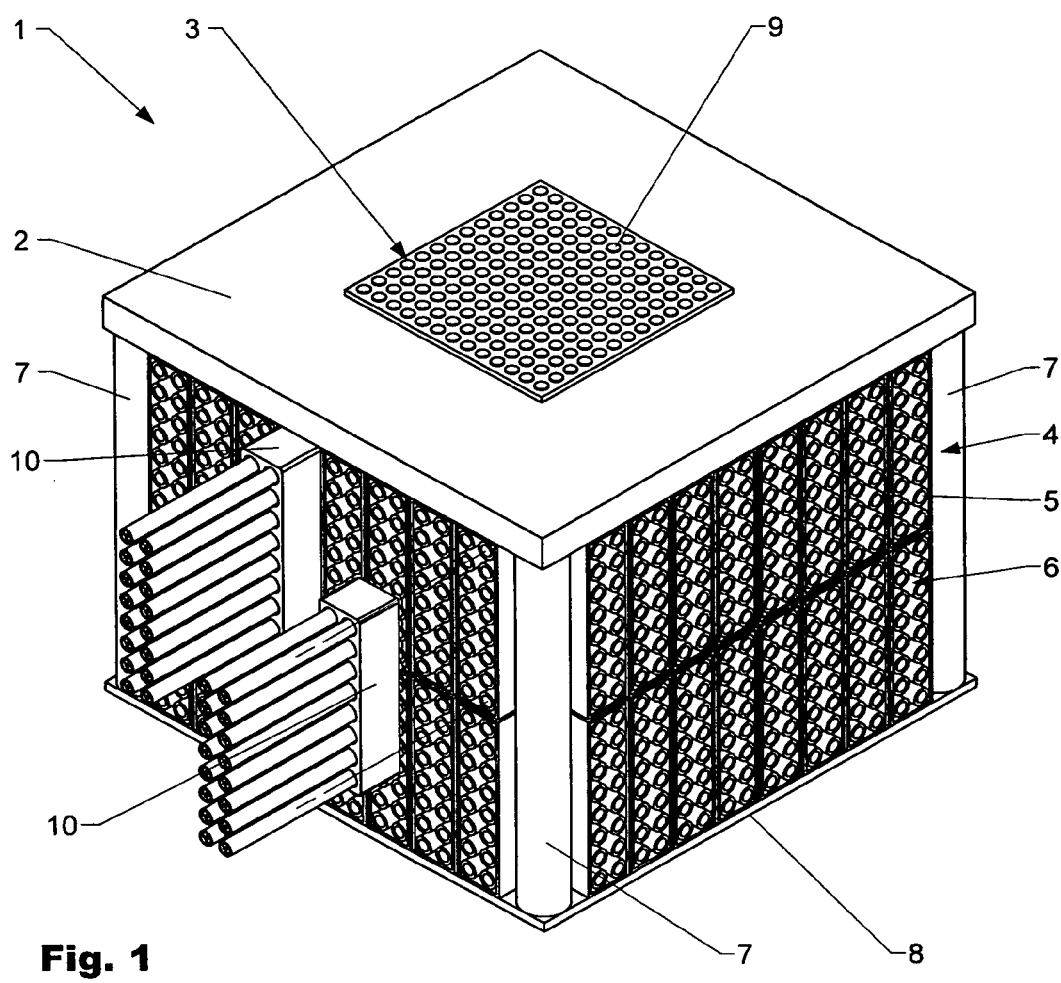
FIG. 1 shows a test adapter and plug connector obliquely from above.
Figure 2:
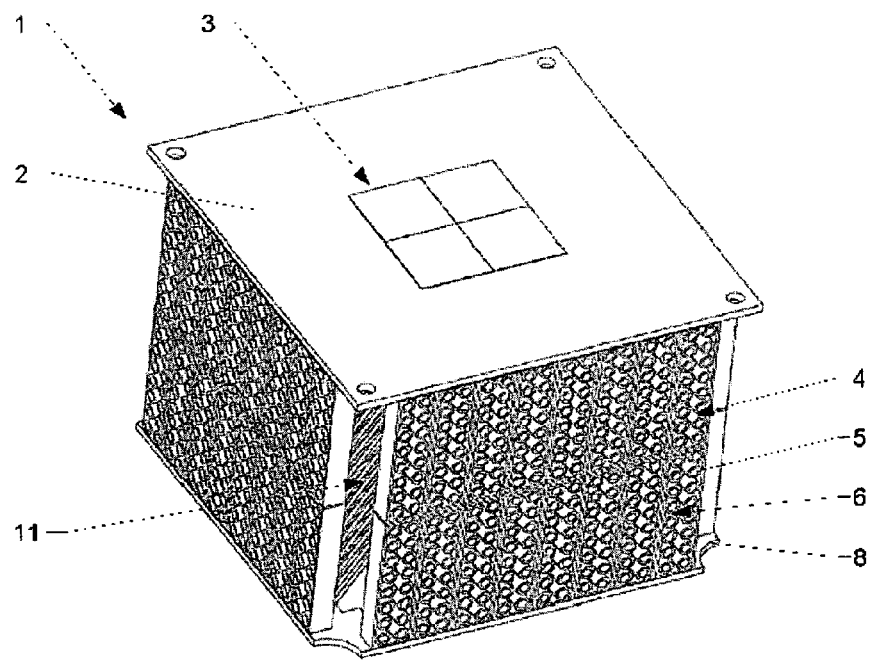
FIG. 2 shows the test adapter obliquely from above.
Figure 3:
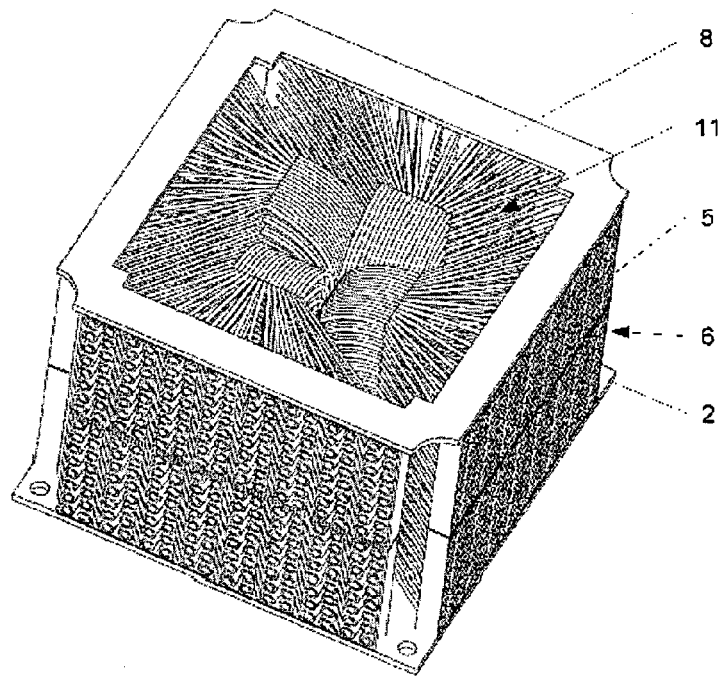
FIG. 3 shows the test adapter obliquely from below.
Figure 4:
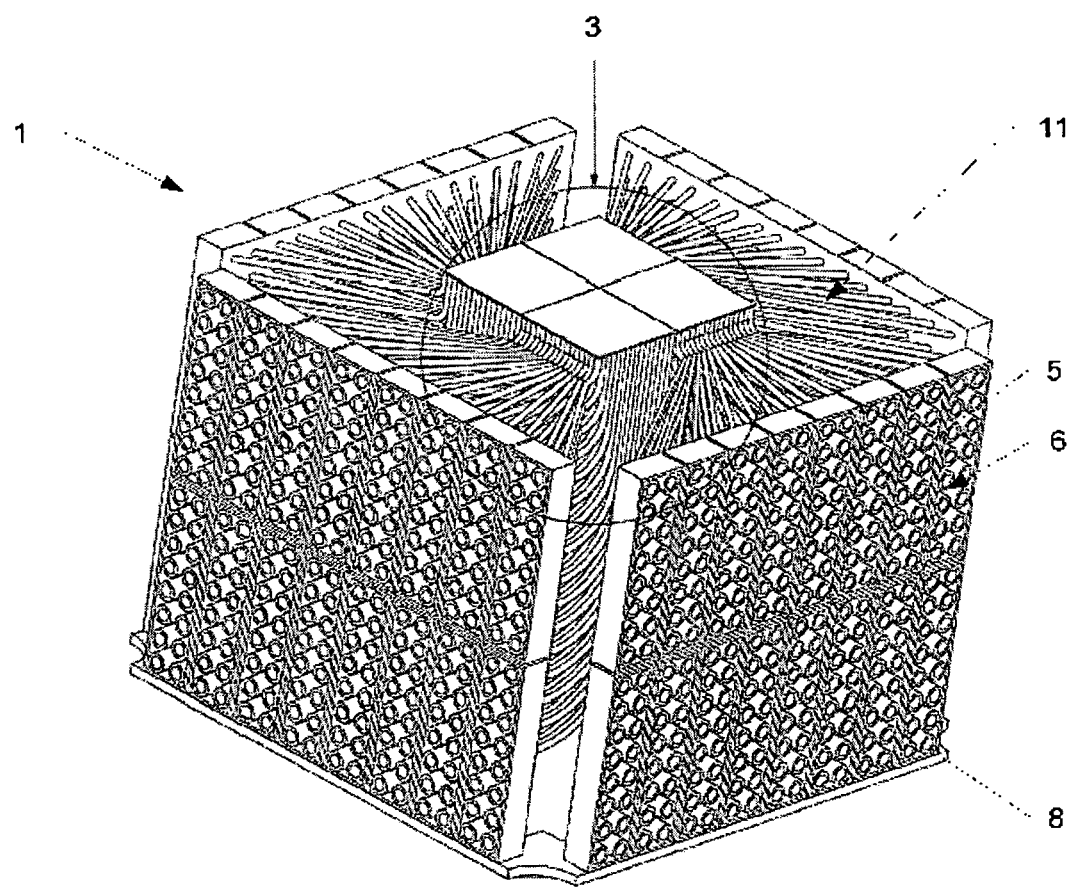
FIG. 4 shows the inner workings of the test adapter.

FIGS. 1 and 2 show a test adapter 1 according to the invention obliquely from above, and FIG. 3 shows the test adapter 1 obliquely from below. FIG. 4 shows the inner construction of a test adapter 1 in a simplified manner.

In the embodiment shown, the test adapter 1 has approximately the shape of a cube with a cover plate 2 having a contact array 3 in the centre. The contact array 3 has a multiplicity of individual contact elements 9 which are arranged specifically with respect to the contact regions of a chip (not illustrated in greater detail) to be tested and can vary from chip to chip. The contact elements 9 can be configured such that they can be operatively connected directly to the contact regions of a chip. The contact elements can be embodied as resilient pins which yield rearwards in the event of axial pressure counter to the force of a spring. The pins can be provided with a point or a round head. Other embodiments are possible. By way of example, there is the possibility of using selectively conductive polymer as an interlayer.

Alternatively or supplementarily it is possible to provide adapter plates (not illustrated in greater detail) which are arranged between chip and test adapter during testing and serve for connection between the contact elements of the contact array 3 and the chip. The test adapter 1 can as required have holding means and/or centering means for adapter plates and/or the chip in order that the latter assume a defined position relative to the contact array during testing. The holding or centering means can be operatively connected to the cover plate 2. There is likewise the possibility of providing a centering and holding frame (not illustrated in greater detail) which is arranged movably around a hinge and which is fixed e.g. to the cover plate 2. By means of the centering and/or holding frame, a chip can be pressed against the contact array 3 over the whole area in a controlled manner. One advantage here is that, in the case of a suitable locking, the forces can be concentrated in the cover plate, such that the surrounding structure is not excessively loaded.

In the embodiment shown, the parallelepipedal test adapter has four side walls 4 arranged at an angle of 90° with respect to the cover plate 2. Other embodiments are possible. By way of example, the test adapter can have the form of a truncated pyramid in which the side walls 4 are at a larger angle of greater than 90° relative to the cover plate 2. The test adapter can as required also have a crooked construction in which the baseplate and the cover plate are arranged offset relative to one another or at an angle with respect to one another.

The side walls 4 have a number of individual connectors 5 corresponding to the number of contact elements 9 of the contact array 3. Said individual connectors, as illustrated in the embodiment shown, can be merged to form multiple connectors 6 which are operatively connected to a test device jointly by means of corresponding plug connectors 10. Other arrangements of the side walls 4 and connectors 5 are possible depending on the field of application. By way of example, more or fewer than four side walls can be provided.

The contact elements 9 of the contact array 3 and the individual connectors 5 are preferably connected to one another by means of coaxial cables 11. For leading through the cables, the cover plate has one or a plurality of through openings (not illustrated in greater detail). In order to simplify manufacturing, the test adapter can have a modular construction which is subdivided in segment-like fashion and which permits simple disassembly of the side walls and the contact elements 9 of the contact array 3 that are assigned to said side walls (indicated schematically in FIG. 2)

The multiple connectors 6 or respectively the plug connectors of the embodiment shown are so-called multiple coaxial connectors each having eight coaxial individual connectors 5. During test operation, the multiple connectors 6 are typically operatively connected via multiple plugs mounted on cables (not illustrated in greater detail) to a test device, serving to thoroughly test the functions of chips.

FIG. 1 reveals peripherally arranged posts 7 that form a part of the supporting structure and rigidly connect the cover plate 2 to a baseplate 8. The cover plate 2 has a thickness chosen such that no adversely resulting deformation occurs when a chip is pressed against the contact array 3 from above during testing. 35 Instead of or to supplement the posts 7, the side walls 4 can perform supporting functions.

It has been shown that it is advantageous in certain cases if the individual connectors 5 are mounted in floating fashion in one of the connector parts 6, 10 at least on one side. What is thereby achieved is that inaccuracies and dimensional deviations do not have any adverse effect.

The cover plate 2 and the posts 7 have been removed in FIG. 4, such that the inner workings of the test adapter are better revealed. It can be discerned how the cables 11 operatively connect the individual connectors 5 to the corresponding contact elements of the contact array 3 (framed here by a circle). It goes without saying that it is also possible to use individual connectors and/or multiple connectors 6 other than those illustrated here.

Switzerland Patent Reference 01910/08, the priority document corresponding to this invention, and its teachings are incorporated, by reference, into this specification.

I claim:

1. A test adapter (1) for operatively connecting a chip to be tested to a test device, wherein the test adapter (1) comprises:
   a baseplate (8);
   a cover plate (2) spaced apart from the baseplate (8) with a contact array (3) having contact elements (9) coordinated with the chip to be tested in terms of number and arrangement;
   side walls (4) which are arranged between the baseplate (8) and the cover plate (12) that frame within a center the contact array (3) and comprise, in a manner arranged at an angle with respect to the cover plate (2), a number of individual connectors (5) that is coordinated with the chip to be tested; and
   wherein the contact elements (9) of the contact array (3) are connected to the individual connectors (5) by spatially curved lines to form a three-dimensional connection array within the sidewalls having multiple rows and multiple columns of the individual connectors (5) along each side wall (4) of the side walls (4).

2. The test adapter (1) of claim 1, wherein the cover plate (2) and the baseplate (8) are operatively connected by structure-bearing elements (7).

3. The test adapter (1) of claim 1, wherein the contact elements (9) of the contact array (3) and the individual connectors (5) are operatively connected to one another by coaxial and/or optical lines (11).

4. The test adapter (1) of claim 3, wherein the coaxial and/or optical lines (11) have approximately the same length at least in pairs.

5. The test adapter (1) of claim 1, wherein a plurality of individual connectors (5) are combined in a multiple connector (6).

6. The test adapter (1) of claim 1, wherein the contact array (3) has a segment-like construction, wherein the contact elements (9) of each segment are assigned to the individual connectors (5) of a side wall (4).

7. The test adapter (1) of claim 1, wherein the individual connectors (5) have a coaxial and/or an optical construction.

8. The test adapter (1) of claim 1, wherein the test adapter (1) has a parallelepipedal or cubic configuration.

9. The test adapter (1) of claim 1, wherein the cover plate (2) has means for centering an intermediate plate and/or a chip.

10. The test adapter (1) of claim 1, wherein the cover plate (2) further comprises:
    a centering and/or holding frame that serves for at least one of centering and pressing a chip against the contact elements (9) of the contact region (3).

11. A test adapter (1) for operatively connecting a chip to be tested to a test device, wherein the test adapter (1) comprises:
    a baseplate (8);
    a cover plate (2) spaced apart from the baseplate (8) with a contact array (3) having contact elements (9) coordinated with the chip to be tested in terms of number and arrangement; and
    side walls (4) which are arranged between the baseplate (8) and the cover plate (2) that frame within a center the contact array (3) and comprise, in a manner arranged at an angle with respect to the cover plate (2), a number of individual connectors (5) that is coordinated with the chip to be tested, the contact array (3) having a segment-like construction wherein the contact elements (9) of each segment are assigned to the individual connectors (5) of a side wall (4) and the number of individual connectors (5) are arranged in a three-dimensional connection array having multiple rows and multiple columns of the individual connectors (5) along each side wall (4) of the side walls (4), the contact elements (9) of the contact array (3) and the individual connectors (5) are operatively connected to one another by spatially curved coaxial and/or optical lines (11) within the sidewalls.

12. The test adapter (1) of claim 11, wherein the cover plate (2) and the baseplate (8) are operatively connected by structure-bearing elements (7).

13. The test adapter (1) of claim 11, wherein the coaxial and/or optical lines (11) have approximately the same length at least in pairs.

14. The test adapter (1) of claim 13, wherein a plurality of individual connectors (5) are combined in a multiple connector (6).

15. The test adapter (1) of claim 14, wherein the individual connectors (5) have a coaxial and/or an optical construction.

16. The test adapter (1) of claim 15, wherein the test adapter (1) has a parallelepipedal or cubic configuration.

17. The test adapter (1) of claim 16, wherein the cover plate (2) has means for centering an intermediate plate and/or a chip.

18. The test adapter (1) of claim 17, wherein the cover plate (2) further comprises:
   a centering and/or holding frame that serves for at least one of centering and pressing a chip against the contact elements (9) of the contact region (3).

\* \* \* \* \*